(12) United States Patent
King et al.

(10) Patent No.: US 6,272,511 B1
(45) Date of Patent: Aug. 7, 2001

(54) WEIGHTLESS BINARY N-TUPLE THRESHOLDING HIERARCHIES

(75) Inventors: Douglas B. S. King, Nr Preston; Ian P. MacDiarmid; Colin Moore, both of Preston, all of (GB)

(73) Assignee: BAE Systems plc, Farnborough (GB)

( * ) Notice: Subject to any disclaimer, the term of this patent is extended or adjusted under 35 U.S.C. 154(b) by 0 days.

(21) Appl. No.: 09/366,568

(22) Filed: Aug. 4, 1999

Related U.S. Application Data

(63) Continuation of application No. PCT/GE98/03837, filed on Dec. 18, 1998.

(30) Foreign Application Priority Data

Dec. 19, 1997 (GB) .................................................. 9726752
Oct. 27, 1998 (GB) .................................................. 9823382

(51) Int. Cl.$^7$ .................................................. G06F 17/15
(52) U.S. Cl. .................................................. 708/423; 708/210
(58) Field of Search .................................................. 708/423, 210; 382/218, 221, 222; 714/777

(56) References Cited

U.S. PATENT DOCUMENTS

| | | | |
|---|---|---|---|
| 3,745,526 | * 7/1973 | Hong et al. ........................ | 714/777 |
| 5,029,305 | 7/1991 | Richardson ........................ | 341/159 |
| 5,382,955 | 1/1995 | Knierim ........................ | 341/64 |
| 5,459,466 | 10/1995 | Knierim et al. ........................ | 341/160 |
| 5,541,865 | * 7/1996 | Ashkenazi ........................ | 708/210 |
| 5,544,280 | 8/1996 | Liu et al. ........................ | 395/24 |
| 5,623,519 | 4/1997 | Babcock ........................ | 375/316 |
| 5,923,779 | * 7/1999 | Ohmi et al. ........................ | 382/218 |

FOREIGN PATENT DOCUMENTS

| | | |
|---|---|---|
| 0 217 009 | 4/1987 | (EP) . |
| 0 221 238 | 5/1987 | (EP) . |
| 2 112 194 | 7/1983 | (GB) . |
| 2 223 369 | 4/1990 | (GB) . |
| 7-95091 | 4/1995 | (JP) . |

OTHER PUBLICATIONS

The Secrets of the WISARD, pp. 73–93.

Hands et al, "Proposal for Stochastic Bit Stream Processing Using Optoelectronic Smart Pixels: A Neural Network Architectural Case Study", *Journal of Parallel and Distributed Computing*, vol., No. 1, Feb. 25, 1997, pp. 92–108.

Leighton et al, "On Probabilistic Networks for Selection, Merging and Sorting", 7$^{TH}$ Annual ACM Symposium on Parallel Algorithms and Architectures SPAA '95, Santa Barbara, Jul. 17–19, 1995, no. Symp. 6, Jul. 17, 1995, pp. 106–118.

* cited by examiner

Primary Examiner—David H. Malzahn
(74) Attorney, Agent, or Firm—Nixon & Vanderhye P.C.

(57) ABSTRACT

A novel architecture is described for applying a sum and threshold function to a weightless input string and a weightless threshold string.

The sum and threshold function is carried out by distributing the input bits in random manner (12) between a number of sum and threshold devices (14), whose outputs are supplied to a second layer of one or more sum and threshold devices (16).

10 Claims, 8 Drawing Sheets

WEIGHTLESS CROSS HAMMING ELIMINATION CELL

WEIGHTLESS SHIFT DOWN CELL

WEIGHTLESS OR UP EDGE CELL

WEIGHTLESS SHIFT UP CELL

WEIGHTLESS OR DOWN EDGE CELL

WEIGHTLESS BINARY N-TUPLE THRESHOLDING HIERARCHIES

This is a continuation of PCT application Ser. No. PCT/GB98/03837, filed Dec. 18, 1998, the entire content of which is hereby incorporated by reference in this application.

BACKGROUND OF THE INVENTION

1. Field of the Invention

This invention relates to weightless binary n-tuple thresholding hierarchies, and in particular, but not exclusively to weightless binary Hamming value comparators and related methods, for use, for example in weightless binary neural networks.

2. Discussion of Prior Art

There are very many applications where a large number of weightless binary inputs need to be summed and compared to a threshold value. For example in the template matcher or neural pattern correlators described in our co-pending International Patent Application Nos. PCT/GB98/03834 (U.S. Ser. No. 09/368,585); PCT/GB98/03835 (U.S. Ser. No. 09/370,892); PCT/GB98/03832 (U.S. Ser. No. 09/368,584); or PCT/GB98/03833 (U.S. Ser. No. 09/371,270), require or; provide architectures for carrying out summing and thresholding of binary weightless strings. The entire contents of the above Applications are incorporated herein by reference.

Conventional systems are synchronous using clocked counters or registered accumulators or clock-based machine/processor technology, but these suffer from high noise, low speed and are not particularly fault tolerant.

SUMMARY OF THE INVENTION

It is therefore an aim of this invention to provide improved forms of weightless binary Hamming value comparators, and in particular tuple thresholding hierarchies for weightless binary neural networks. The inventors have found that it is practical to use probabilistic rather than deterministic methods for performing a sum and threshold function for large numbers of inputs and have developed novel hierarchies for distributed template matching and weightless binary neural network pattern detection.

Accordingly in one aspect this invention provides a weightless binary comparator for comparing the Hamming value of N weightless inputs with a threshold T and for indicating if said Hamming value passes said threshold, which comprises:

means for applying respective sub-groups of said weightless inputs to sum and threshold means, means for applying a threshold value to each of said sum and threshold means, and means for passing the outputs of said sum and threshold means to a sum and threshold means for providing an output indicative of whether the Hamming value of the weightless inputs passes said threshold.

Preferably, said threshold is a weightless threshold.

In another aspect this invention provides a method of comparing the Hamming value of N weightless inputs with a threshold T, which comprises applying a sum and threshold operation to respective subgroups of said inputs to obtain respective outputs, and applying a sum and threshold operation to said respective outputs to obtain an output indicative of whether the Hamming value of said weightless inputs passes said threshold.

Preferably, said threshold is a weightless threshold.

In another aspect, this invention provides apparatus for processing weightless binary input data, which comprises:

a plurality of processing modules each for operating on a plurality of bits of said input data and providing an output, means for distributing respective bits from said weightless binary input data between respective processing modules, and means for passing output data from said processing modules to a processing module to provide a processed output.

In a further aspect, this invention provides a method for processing weightless binary input data, which comprises:

providing a plurality of processing modules each for operating on a plurality of bits of input data and providing an output;

distributing respective bits from said weightless binary input data between respective processing modules and passing output data from said processing modules to a processing module to provide a processed output.

Whilst the invention has been described above it extends to any inventive combination of the features set out above or in the following description.

BRIEF DESCRIPTION OF THE DRAWINGS

The invention may be performed in various ways, and embodiments thereof will now be described in detail, by way of example only, reference being made to the accompanying drawings, in which.

DETAILED DISCUSSION OF THE PREFERRED EMBODIMENTS

Figure 1:
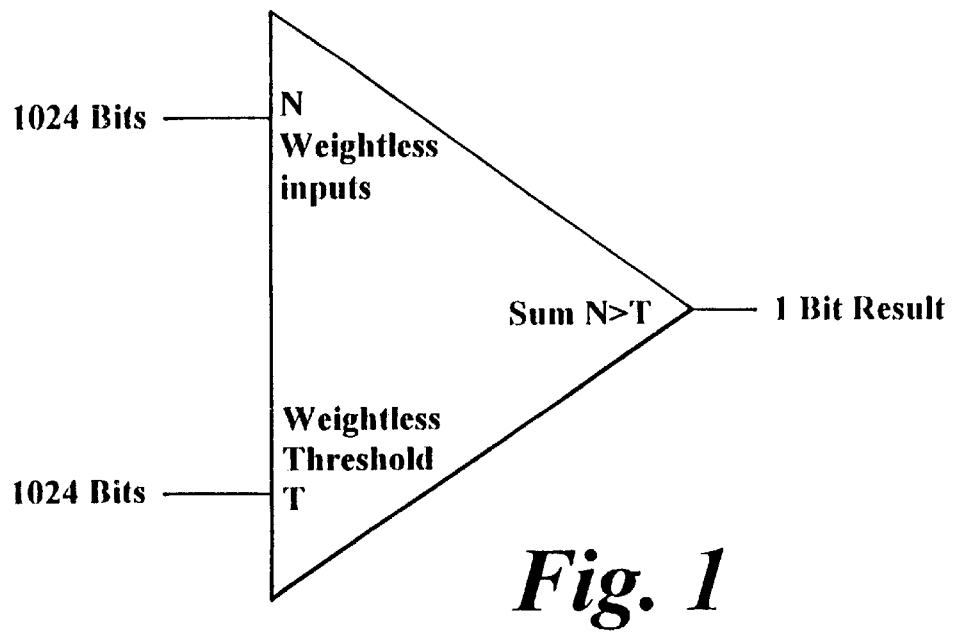
FIG. 1 is a schematic view of an embodiment of a weightless binary N-tuple threshold comparator in accordance with this invention.

The embodiments described below address the problem of applying a sum and threshold operation when the number of weightless input and weightless threshold bits is very large. An example is given in FIG. 1 of the accompanying drawings where there are 1024 weightless input bits and 1024 weightless threshold bits, and the sum and threshold device must provide a single bit output indicating whether the sum of the weightless inputs exceeds the sum of the weightless threshold bits. The need for such a comparison is common in pattern matching and template matching in neural networks. The embodiments described below take the threshold comparator and consider its hierarchical applications to distributed template matching and weightless binary neural network feature detection.

Figure 2:
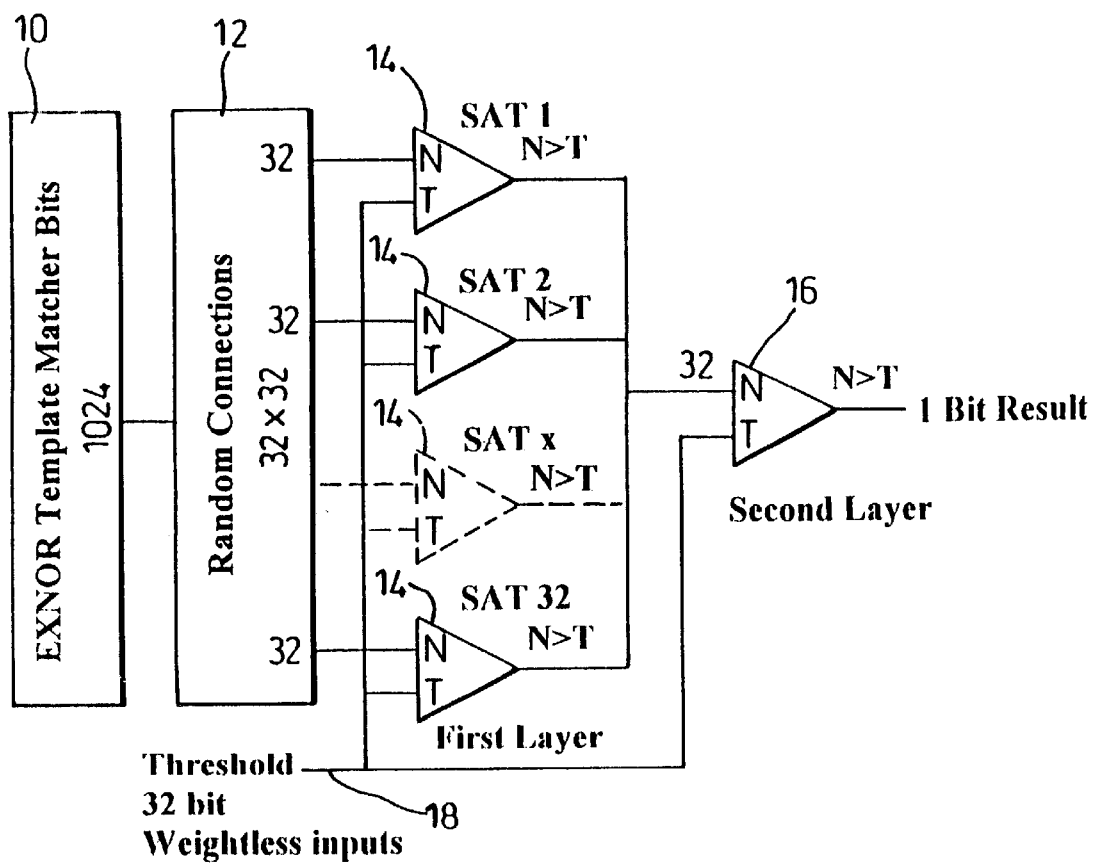
FIG. 2 is a diagram of an embodiment of a weightless binary N-tuple threshold hierarchy.

Referring to FIG. 2, a device is shown for performing a sum and threshold operation on the 1024 template matcher bits in a template matcher. This could for example be a novel template matcher of the type described in one or more of our co-pending Applications referred to above. The block 10 of 1024 template matcher bits is randomised by a random connection block 12 to provide thirty two groups of thirty two bits. Each group of bits passes to a respective one of thirty two sum and threshold devices 14. The single bit outputs of the thirty two sum and threshold devices 14 pass as inputs to a single, second layer sum and threshold device 16 which provides a single bit result. In this example, the threshold supplied to all the sum and threshold devices 14 and to the output sum and threshold device 16 is the same and is a thirty two bit weightless input applied on a bus 18.

In a standard mode of operation, the actual required threshold is scaled by thirty two (because there are thirty two sum and threshold devices). Thus, with an input of 1024 bits, if the actual threshold required was 512, the threshold applied on line 18 would be sixteen (512÷32). Each sum and threshold device may either be of conventional form or one of the novel Hamming value comparators described in one or more of our co-pending Applications.

Statistically it can be shown that it is important that there are many (for example more than sixteen) inputs to each sum and threshold element 14, 16. The actual selection of the number of inputs is a trade-off between a higher number giving a better resolution and a lower number reducing the complexity of the device. The embodiments of this invention rely on a probabilistic rather than deterministic analysis.

In other words it is assumed that if, say, 640 input bits are 1's the random connection block will distribute these set bits evenly between the sum and threshold devices of the first layer, with each sum and threshold device receiving an average of twenty set bits of course, in practice, some sum and threshold devices are likely to receive more and some less. Assuming that the actual threshold against which the sum of the input bits is to be compared is 608, this will be scaled as described above so that the threshold bits supplied to each sum and threshold device 14, 16, will be exactly 19. Provided that the input bits are randomly distributed between the sum and threshold devices 14 of the first layer, it is likely that most of the first layer sum and threshold devices will fire because the number of weightless inputs exceeds 19. The outputs of the first layer sum and threshold devices 14 will then be summed and compared with the value 19 again and, in most instances, the second layer sum and threshold device will fire.

In the above example the number of trials, 1024, has been chosen for experimental reasons to form 32 tuples each of 32 weightless elements. Each tuple is a sample of the population. The "weak law of large numbers" states that the tuple mean approaches the true mean as the tuple size approaches infinity, in accordance with the central limit theorem. For small tuple sizes, an unacceptably large error is introduced. For tuple sizes greater than approximately 16, the technique is practically viable.

It is important to randomly connect the pattern matcher outputs between the data space and the hierarchical structure because the pattern matchers can often "clump" results, e.g. 1111111011000000001 is typical of a non-random matcher result—in this case showing a skewing of 1's to the left. In practice the skew may be in any position.

The matcher bit results are usually required to be of the form of a Bernouilli trial—i.e. the probability distribution for the 1's and 0's should be uniformly distributed by deliberately making random wiring connections. Each of the first layer sum and threshold devices 14 of FIG. 2 is seen to randomly sample the data space.

There may be certain applications that do not want this random mapping—in general, if the trials are not of the Bernouilli form there will need to be a greater bias in the quantity of 1's before the n-tuple threshold detector "fires". In neural systems this could be important—data uniformly distributed and applied will "fire" more readily than skewed data. Hence the network will tend to reject skewed data. This is a feature lacking in the prior art. Hence the inclusion of the "randomiser" is application dependent. As the data size and tuple size increase, the result, statistically, tends towards ideal.

Figure 3:
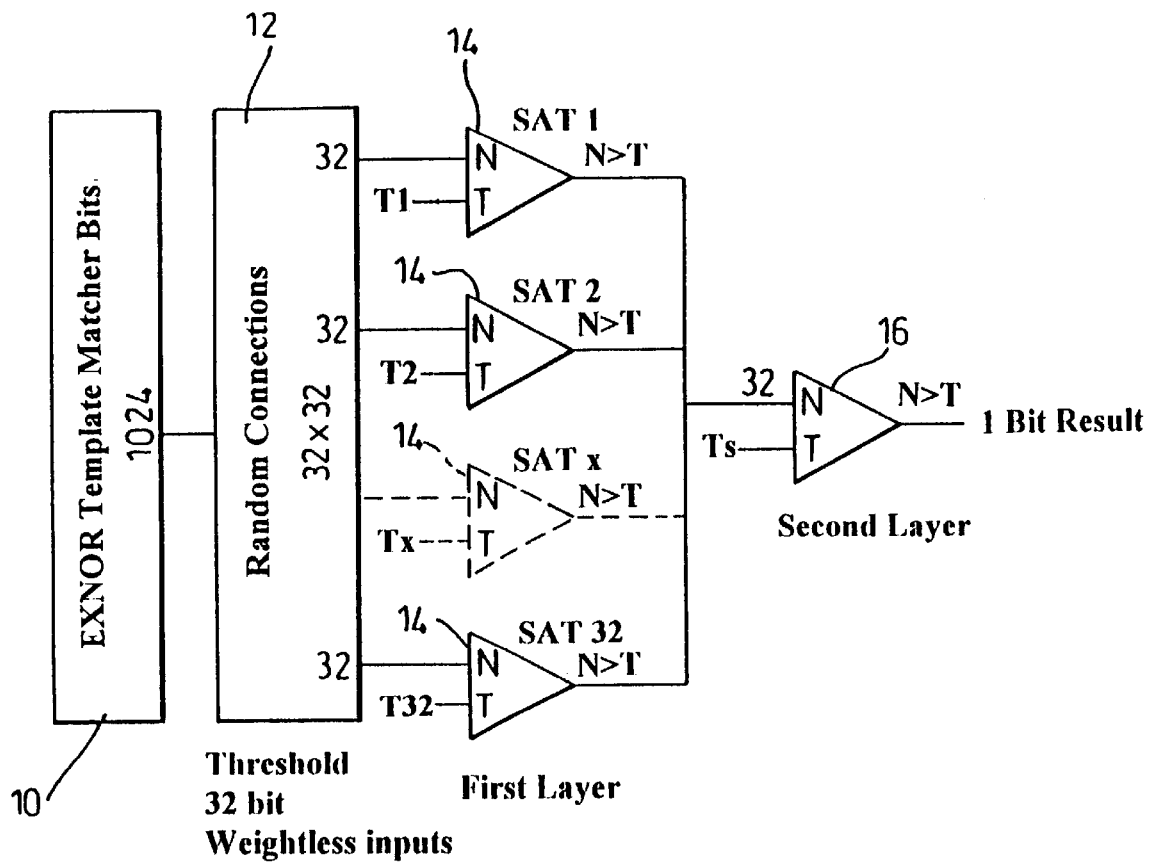
FIG. 3 is a diagram of an embodiment of a distributed threshold N-tuple comparator in accordance with this invention.

FIG. 3 shows a second embodiment of generally similar form to that of FIG. 2, except that it provides the use of different thresholds for each sum and threshold device 14, 16 in the hierarchy. The randomiser block 12 would not normally be used in this modification. There could exist threshold profiles e.g. for the n=32 bit example, the thresholds for the first layer could be:
For T1 to T32
12 12 13 13 14 14 14 15 15 15 16 16 16 17 18 19 19 18 17 16 16 16 12 12 15 14 14 14 13 13 12 12 (the threshold profile does not have to be symmetrical)
The second layer threshold could be 17. Thresholds would be chosen according to application. This idea may be applied to the analysis of signals impinging a phased array signal detector. Also, in visual pattern detection, a bias in terms of exceeding a threshold may need to be given to certain areas of the image.

Figure 4:
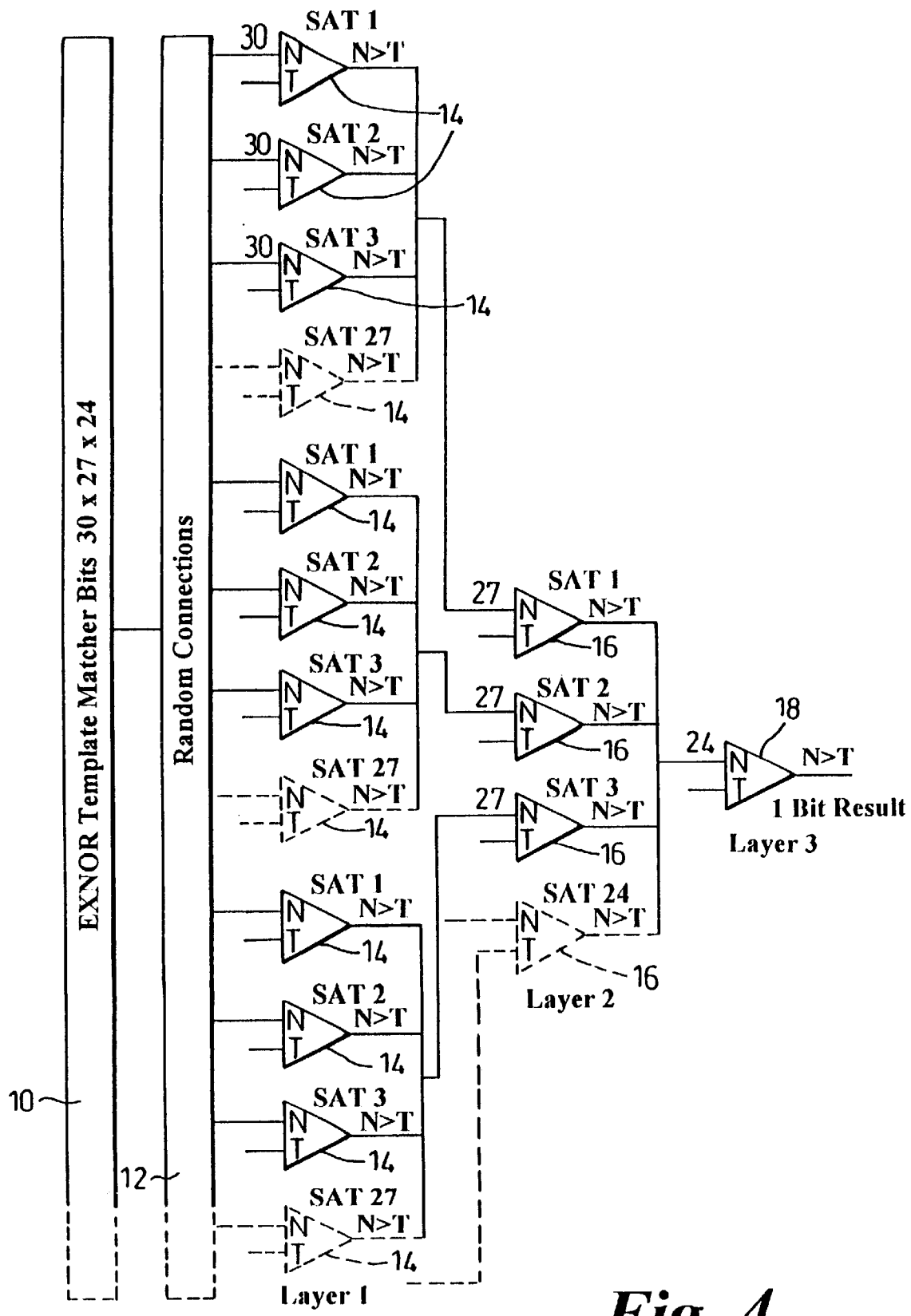
FIG. 4 is a block diagram of an embodiment of a variable sum-and-threshold block size N-tuple comparator in accordance with this invention.

Another modification is shown in FIG. 4 in which several layers of groups or cells of sum and threshold devices may be used. For example in the example shown the template matcher has 30×27×24 bits, and this is accommodated by providing in the first layer 24 groups each of 27 sum and threshold devices each having 30 inputs, and ending in a third layer comprising a single 24 input sum and threshold device 18. Like components are given like reference numerals.

Figure 5:
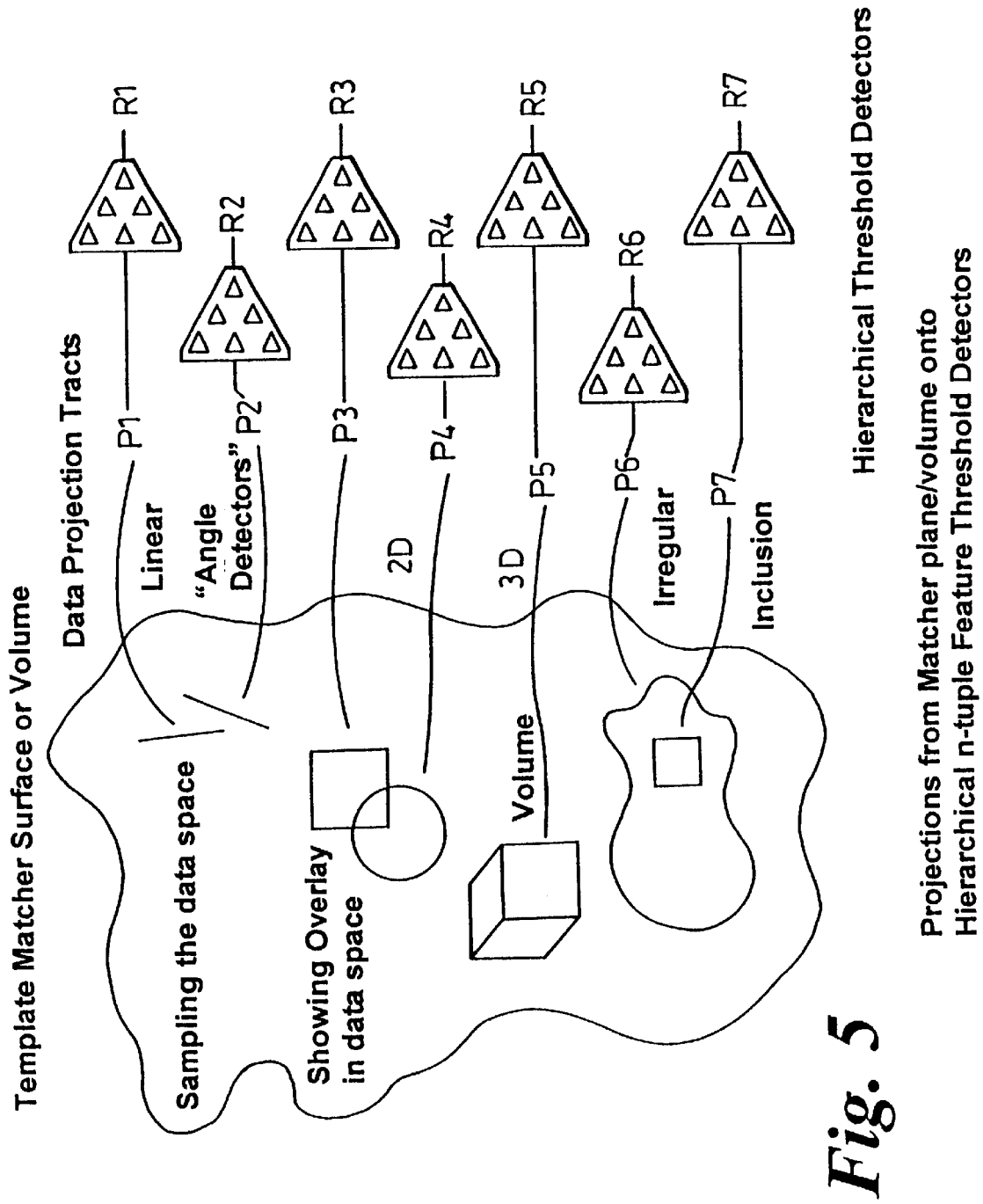
FIG. 5 is a schematic diagram showing random mapping of data projected onto hierarchical threshold detectors.

It should be noted that the embodiments described herein are applicable to 1D, 2D and 3D data spaces as highlighted in FIG. 5. FIG. 5 also shows that a system may comprise a plurality of hierarchical threshold detectors operating on a template matcher surface or volume.

Figure 6:
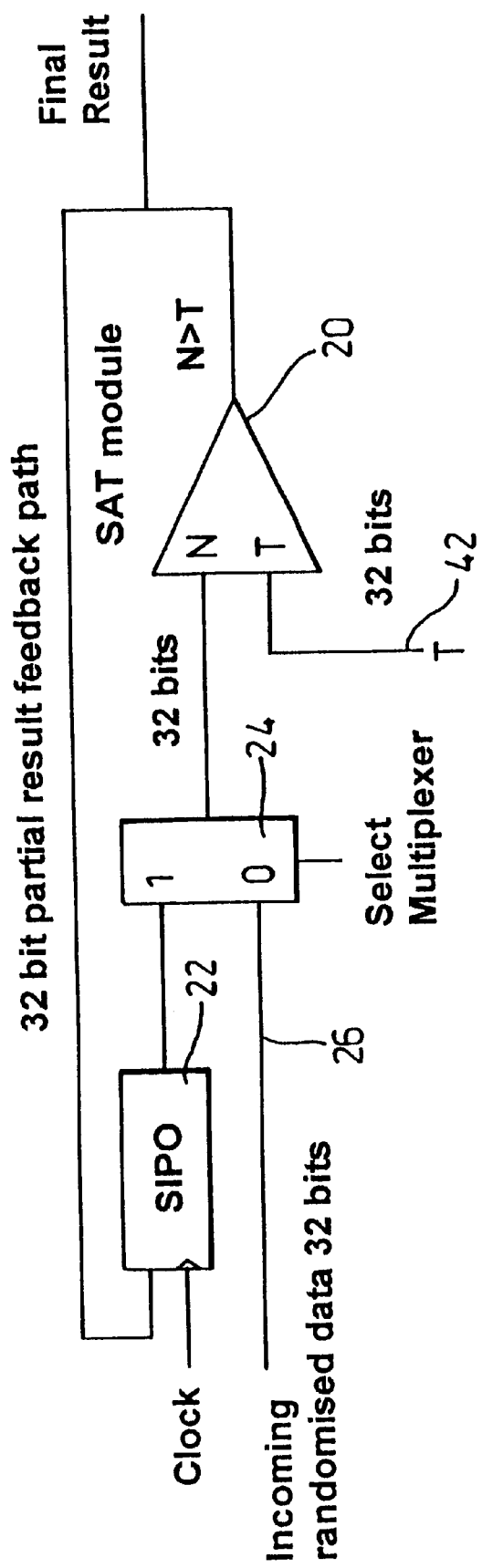
FIG. 6 is an embodiment of a hybrid semi-parallel, semi-asynchronous N-tuple threshold comparator.

Referring now to FIG. 6, a combination of the prior art (clocked devices) with the sum and threshold (Hamming value comparator) techniques described in our co-pending International Patent Applications yields a hybrid solution. FIG. 6 shows a hybrid block diagram for the implementation of FIG. 2. The random connections are not shown.

In the example of FIG. 6 the comparator is shown performing a sum and thresholding operation on 1024 bits. There is a single 32 bit sum and threshold device 20 receiving the usual 32 bit weightless threshold and providing a single output bit which at intermediate stages of the sum and threshold operation is passed to a serial in parallel out (SIPO) shift register 22. At the final stage, the output bit of the sum and threshold device 20 is made available as the final result. Incoming randomised data of 32 bit width is supplied on line 26 to the multiplexer 24. During intermediate stages, the select multiplexer passes the 32 bit data to the input of the sum and threshold device 20. The SIPO shift register 22 operates as a partial result store and once 32 sum and threshold operations have been carried out the select multiplexer 24 passes the 32 bit data from the SIPO shift register 22 to the sum and threshold device 20 to obtain the final single bit result.

It should be noted that the above embodiment could be modified to be either fully parallel or fully asynchronous.

Figure 7:
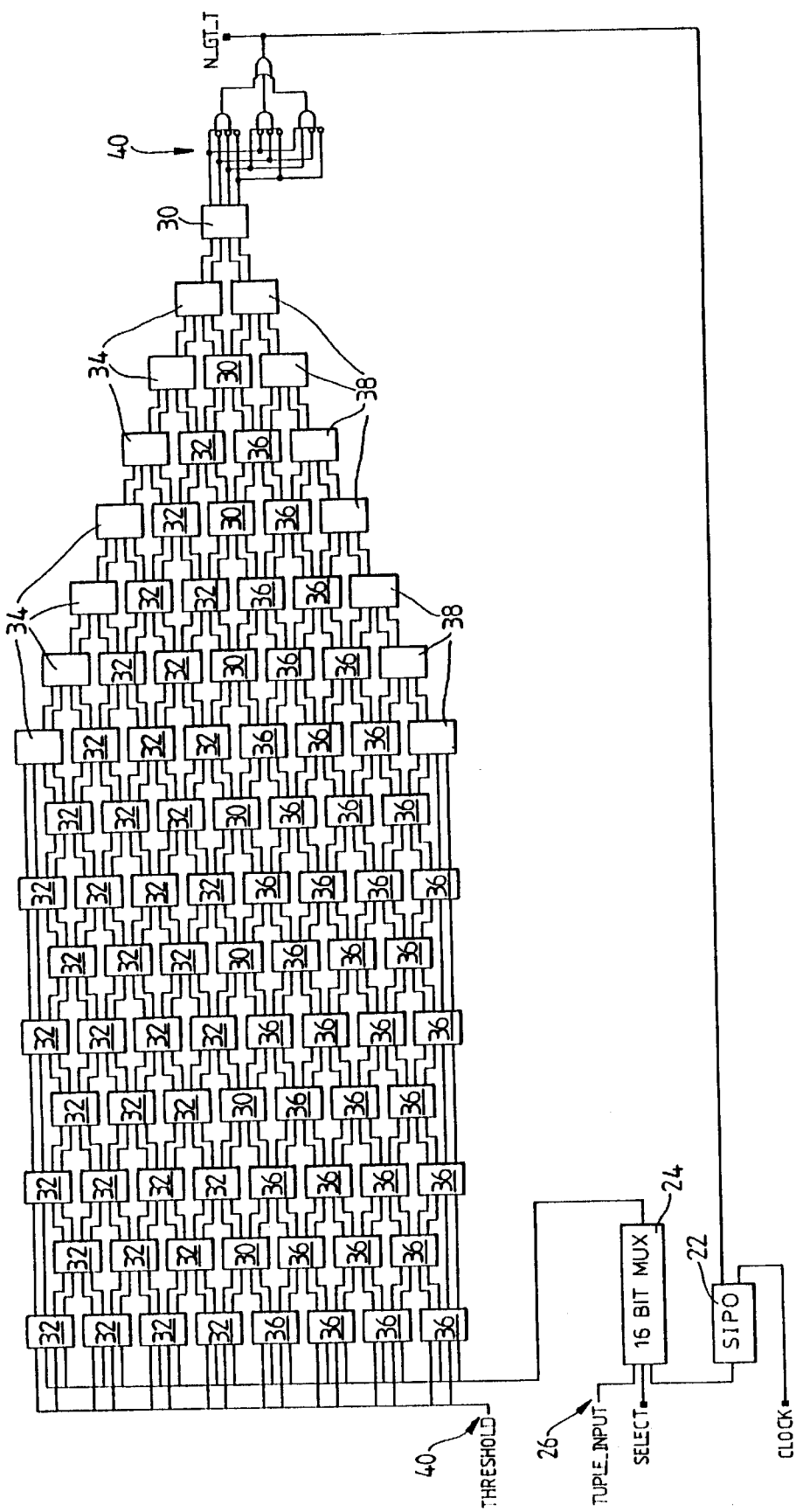
FIG. 7 is a block diagram of an embodiment of a hybrid semi-parallel, semi-asynchronous N-tuple threshold hierarchy as set out in FIG. 6.
Figure 8A:
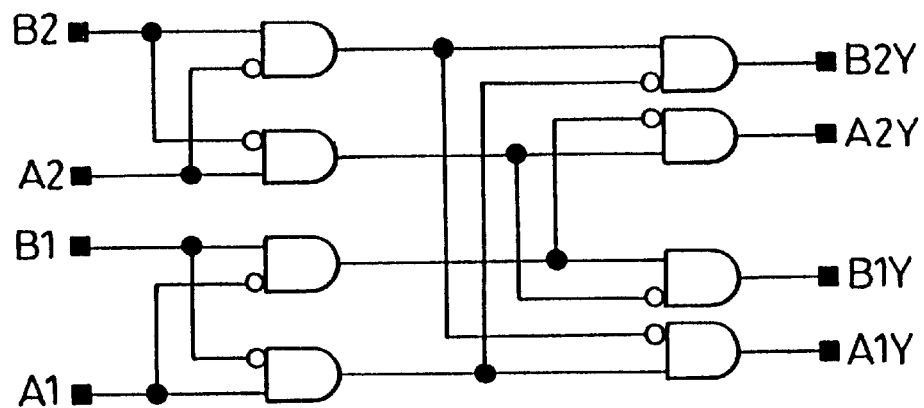
FIGS. 8(a), (b), (c), (d) and (e) are diagrams of various bit manipulation cells used in the comparator of FIG. 7.
Figure 8B:
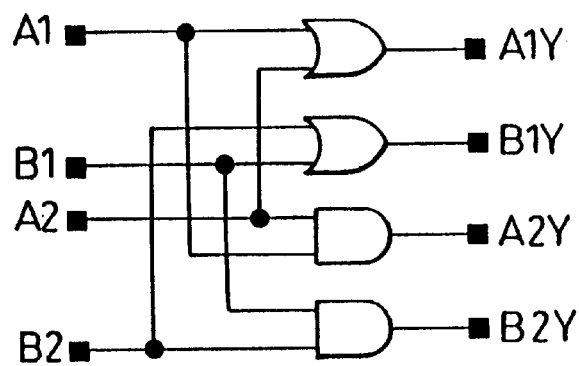
Figure 8C:
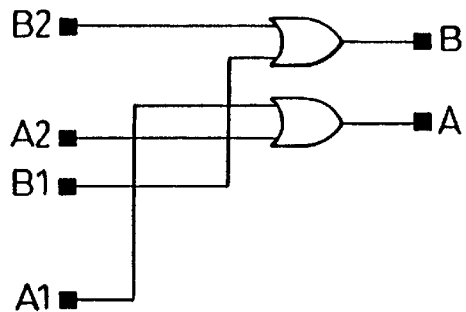
Figure 8D:
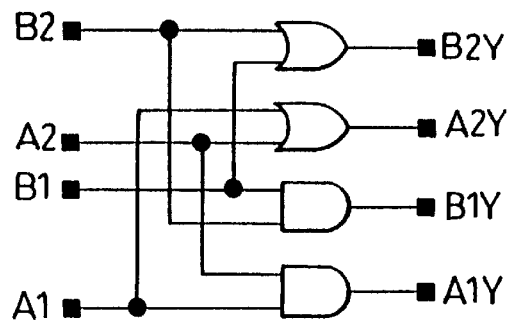
Figure 8E:
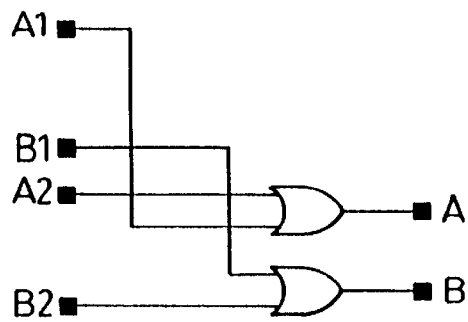

Referring now to FIG. 7 there is shown a more detailed view of an arrangement of the type shown in FIG. 6 although the example of FIG. 7 operates on 16 bit data. In FIG. 7, the sum and threshold device 20 is constituted by an array 28 of five different types of bit manipulation cells. The cells are identified as weightless cross Hamming elimination cells 30 (FIG. 8(a)); weightless shift down cells 32 (FIG. 8(b)); weightless OR up edge cells 34; (FIG. 8(c)); weightless shift up cells 36 (FIG. 8(d)), and weightless OR down edge cells 38 (FIG. 8(e)). This device is similar to those described in our co-pending International Patent Applications. The array is symmetrical along the horizontal mid-line. Cells actually appearing on the mid-line comprise weightless cross Hamming elimination cells 30 having a structure and logic arrangement as shown in FIG. 8(a). Bit manipulation cells above the horizontal mid-line (and not affected by truncation from layers five onwards) are weightless shift down cells 32 having a structure and a logic shown in FIG. 8(b). Truncated cells in the upper part comprise weightless OR down edge cells 34 of the structure and logic arrangement shown in FIG. 8(c) In the lower half of the array, the complete cells not affected by truncation are weightless shift up cells 36 of the type shown in FIG. 8(d) and those affected by truncation are weightless OR up edge cells 38 of the type shown in FIG. 8(e). The array operates in a similar fashion to the Hamming value comparator and acts to aggregate set bits in the threshold tuple and the input tuple towards the centre whilst also performing an elimination operation to cancel bits which are set in the same bit position in the threshold and input tuples. The outputs from the final weightless cross Hamming elimination cell 30 are supplied to a decoder 40 which sets a bit at its output if the number of weightless bits at its input are greater than those at the threshold input. As in FIG. 6, the output of the sum and threshold device passes to a SIPO shift register 22 whose output passes to one port of a select multiplexer 24, the other port receiving incoming data on line 26. The threshold is supplied along line 42.

It should be noted that the random connections are not shown in FIG. 7.

In general the implementation of the above arrangement is technology independent; electronic, ionic, magnetic, or electromagnetic (e.g. optical) implementations are all suitable.

What is claimed is:

1. A weightless binary comparator for comparing the Hamming value of N weightless inputs with a threshold T and for providing a probabilistic indication of whether said Hamming value passes said threshold, said comparator comprises:

an input layer of sum and threshold devices each having a plurality of inputs and a threshold input and operable to provide an output indicative of whether the number of set input bits passes a threshold value applied to said threshold input, a distributor for applying respective sub-groups of said weightless inputs to the inputs of respective ones of said sum and threshold devices, a threshold processor for deriving, from said threshold value T, respective thresholds input to said first layer of sum and threshold devices, and a further sum and threshold device, responsive to the outputs of said sum and threshold devices for providing an output representing a probabilistic indication of whether the Hamming value of the weightless inputs passes said threshold.

2. A weightless binary comparator according to claim 1, wherein said threshold T is a weightless binary value.

3. A weightless binary comparator according to claim 1, including a circuit for distributing in non-ordered fashion said inputs to the inputs of said sum and threshold devices.

4. A weightless binary comparator according to claim 1, wherein the same threshold value is applied to each of said input layer of sum and threshold devices.

5. A weightless binary comparator according to claim 1, wherein different threshold values are applied to the input layer of sum and threshold devices.

6. A weightless binary comparator according to claim 1, wherein said input layer of sum and threshold devices includes a hierarchy of more than two layers of sum and threshold devices, wherein respective sub-groups of said weightless inputs are applied to respective sum and threshold devices in a first layer of said hierarchy, respective sets of the outputs of said first layer of sum and threshold devices are applied to respective sum and threshold devices in a second layer, and respective sets of said outputs of said second layer of sum and threshold devices are applied to at least one further layer of at least one sum and threshold device, to obtain said output.

7. A weightless binary comparator, for comparing the Hamming value of N weightless inputs with a threshold T and for providing a probabilistic indication of whether said Hamming value passes said threshold, said comparator comprises:

a sum and threshold device having a plurality of inputs and a threshold input and operable to provide an output indicative of whether the Hamming value of said inputs passes a threshold value applied to said threshold input, an input for supplying to said sum and threshold device respective sub groups of said weightless inputs in sequence, a threshold processor for deriving, from said threshold T, one or more respective thresholds for inputting to said threshold input, a store for storing the output from the sum and threshold device for each said subgroup, and a feedback path for passing said stored outputs to said sum and threshold device to obtain said output representing said probabilistic indication of whether the Hamming value of the weightless inputs passes said threshold.

8. A method of comparing the Hamming value of N weightless inputs with a threshold T and for providing a probabilistic indication of whether said Hamming value passes said threshold, said method comprising the steps of:

processing said threshold T to derive at least a threshold value, applying a sum and threshold operation to respective subgroups of said inputs to obtain respective outputs in which the inputs are summed and thresholded relative to the respective threshold value, and applying a further sum and threshold operation to said respective outputs to obtain an output representing said probabilistic indication of whether the Hamming value of said weightless inputs passes said threshold.

9. A method according to claim 8, wherein said threshold T is a weightless binary value.

10. A weightless binary comparator for comparing the Hamming value of N weightless inputs with a threshold T and for indicating if said Hamming value passes said threshold, said weightless binary comparator comprising:

a plurality of sum and threshold means, each sum and threshold means comprising a means for providing an output indicative of whether an input exceeds a threshold value;

means for applying respective sub-groups of said weightless inputs to corresponding ones of said plurality of sum and threshold means, means for applying a threshold value to each of said sum and threshold means, and means for passing the outputs of said sum and threshold means to a further sum and threshold means for providing an output indicative of whether the Hamming value of the weightless inputs passes said threshold.

* * * * *